(12) United States Patent
Bernasconi et al.

(10) Patent No.: US 7,928,760 B2
(45) Date of Patent: Apr. 19, 2011

(54) INTEGRATED CIRCUIT WITH INPUT AND/OR OUTPUT BOLTON PADS WITH INTEGRATED LOGIC

(75) Inventors: Eric Bernasconi, Vence (FR); Emmanuel Solari, Grasse (FR)

(73) Assignee: NXP B.V., Eindhoven (NL)

( * ) Notice: Subject to any disclaimer, the term of this patent is extended or adjusted under 35 U.S.C. 154(b) by 863 days.

(21) Appl. No.: 11/576,142

(22) PCT Filed: Sep. 5, 2005

(86) PCT No.: PCT/IB2005/052892
§ 371 (c)(1),
(2), (4) Date: Mar. 27, 2007

(87) PCT Pub. No.: WO2006/035330
PCT Pub. Date: Apr. 6, 2006

(65) Prior Publication Data
US 2009/0201049 A1 Aug. 13, 2009

(30) Foreign Application Priority Data

Sep. 27, 2004 (EP) .................................... 04300629

(51) Int. Cl.
*H03K 19/173* (2006.01)
(52) U.S. Cl. ................ 326/38; 326/39; 326/41; 716/16; 714/727; 714/726; 714/738

(58) Field of Classification Search .............. 326/37–41, 326/47; 714/724–731, 733, 736, 738, 30; 716/2, 4, 6, 8; 324/715, 512, 603; 712/227
See application file for complete search history.

(56) References Cited

U.S. PATENT DOCUMENTS

| 6,266,801 B1 * | 7/2001 | Jin ................................... 716/8 |
| 6,539,511 B1 * | 3/2003 | Hashizume ................... 714/727 |
| 7,174,492 B1 * | 2/2007 | Chung et al. .................. 714/727 |

FOREIGN PATENT DOCUMENTS

JP 2003228999 A 8/2003

* cited by examiner

*Primary Examiner* — James H. Cho
*Assistant Examiner* — Christopher Lo

(57) ABSTRACT

An input and/or output pad is dedicated to an integrated circuit comprising a core with input and/or output pins. This pad comprises a pad cell comprising a pad block connected to an input buffer and/or an output buffer and arranged to be connected to one of the core input and/or output pins. The pad also comprises a pad logic module comprising a first and/or a second boundary scan cell, connected to the pad block through the input buffer and/or output buffer and arranged to feed input signals to and/or deliver output signals from the pad block, and control means connected to the first and/or second boundary scan cell(s) and adapted to receive control signals for controlling access to the first and/or second boundary scan cell(s) and feeding the first boundary scan cell with the input signals and/or outputting the output signals delivered by the first boundary scan cell.

18 Claims, 4 Drawing Sheets

INTEGRATED CIRCUIT WITH INPUT AND/OR OUTPUT BOLTON PADS WITH INTEGRATED LOGIC

FIELD OF THE INVENTION

The present invention relates to the domain of integrated circuits, and more precisely to the control of the integrated circuit cores through pads.

BACKGROUND OF THE INVENTION

As it is known by one skilled in the art, the data processing cores of integrated circuits (ICs) are generally surrounded with pads defining together an integrated pad ring. A pad is a cell which receives signals from outside the integrated circuit and drives them to the core through one of its input pins (or terminals) and/or drives the signals outputted by the core through one of its output pins (or terminals). So, the so-called "input pads" are each connected to at least one core input pin, the so-called "output pads" are each connected to at least one core output pin, and the so-called "bi-directional pads" are each connected to at least one core input and output pin as well as an output enable pin. A pad may also be arranged to adapt the voltage levels between the outside of the integrated circuit and the core which can work with different voltage levels.

In order that signals could be driven from the outside of an integrated circuit into its core, it is normally required that the core be powered up. In the same way, in order that signals could be driven from an integrated circuit core to the outside of this integrated circuit, it is normally required that the core be powered up.

When the core is not used by the system to which it belongs, it is useful to power down this core in order to minimise the system power consumption. But, it is difficult to power down a core without risking one of its output pins driving signals on the board, or another integrated input pin inducing an unknown state on it and, therefore, generating noise and/or power consumption issue. It is also difficult to power down a core without the risk of one of its input pins driving non-power logic signals in it which may induce core damages, such as reverse polarisation of transistor junctions.

Moreover, a major part of the pads, which are dedicated to normal functioning of the core, can also be dedicated to testing such as a Boundary Scan Test and also a scan test. In this case the pad configuration is not the same as the one established during normal functioning of the core. For example, a pure bidirectional pad can be forced into input or output mode during a test. Therefore, there are often paths to and from the test pads that cannot be crossed and tested.

The more the cores have different sizes, the more the paths between a core and its pads may vary, which can induce non desirable delays. This is notably the case when test paths are linked to functional paths.

OBJECT AND SUMMARY OF THE INVENTION

So, the object of this invention is to improve the situation at least partly.

For this purpose, it provides an input and/or output (Bolton) pad, for an integrated circuit comprising a core with input and/or output pins, and comprising a pad cell comprising a pad block connected to an input buffer and/or an output buffer and arranged to be connected to one of the core input and/or output pins.

This input and/or output (Bolton) pad is characterized in that it also comprises a pad logic module comprising a first boundary scan cell and/or a second boundary scan cell, connected to its pad block through the input buffer and/or output buffer and arranged to feed input signals to and/or deliver output signals from said pad block, and control means connected to the first and/or second boundary scan cell(s) and adapted to receive control signals for controlling access to the first and/or second boundary scan cell(s) and feeding the first boundary scan cell with the input signals and/or outputting the output signals delivered by the first boundary scan cell.

The input and/or output pad according to the invention may include additional characteristics considered separately or combined, and notably:

its control means may be arranged to forbid the access of the input signals to the first boundary scan cell while allowing the power of the pad cell and pad logic module to be maintained, just before the core is powered down, in order to isolate the core input to which the pad block is connected, the control means may be arranged to feed the first boundary scan cell with a first dedicated signal of a chosen value while forbidding the access of the input signals and allowing the power of the pad cell and pad logic module to be maintained, the control means may comprise:
  i) a first logical AND gate connected to the first boundary scan cell, arranged to receive first input signals for the purpose of core function mode and a lock signal able to get one of two values, and to control the access of the first input signals to the first boundary scan cell in dependence on in dependence on the value of the lock signal, and/or
  ii) a second logical AND gate connected to the first boundary scan cell, arranged to receive second input signals for the purpose of core test mode and the lock signal and to control the access of the second input signals to the first boundary scan cell in dependence on in dependence on the value of the lock signal, the control means may also comprise a general-purpose input path connected to the first boundary scan cell and arranged to feed it with the first dedicated signal, the control means may be arranged to allow the power of the pad cell and pad logic module to be maintained and to forbid the access of the output signals to the first boundary scan cell each time the core is powered down, the control means may be arranged to deliver a second dedicated signal of a chosen value on an output of the pad logic module while forbidding the access of the output signals to the first boundary scan cell and allowing the power of the pad cell and pad logic module to be maintained, the control means may comprise a first switching means arranged to receive a first control signal able to get one of two values and first output signals of core function mode and/or second output signals of core test mode to selectively output them as a function of the value of the first control signals (te).

In this case, the control means may also comprise a second switching means connected to the first boundary scan cell and arranged:
  i) to receive a second control signal able to get one of two values and the first output signals delivered by the first boundary scan cell and
  ii) to selectively output the first output signals intended for the first switching means or the second dedicated signal on a general-purpose output path, in dependence onin dependence on the value of the second control signal, the control means may comprise:
 i) a first switching means connected to the first boundary scan cell and arranged to receive the second control signal and the output signals delivered by the first boundary scan cell and to selectively output the output signals or the second dedicated signal as a function of the value of the second control signals, the control means may also comprise:
a second switching means arranged:
 i) to receive third and fourth control signals able to get one of two values and the second control signal and
 ii) to selectively output the third or fourth control signal in dependence on the value of the second control signal, a first logical OR gate comprising:
 i) a first input arranged to be fed with the first control signal and a second input connected to the second switching means to be fed with the third or fourth control signal, and
 ii) an output connected to the second boundary scan cell and arranged to feed it with the third or fourth control signal in dependence on the value of the first control signal, a second logical OR gate comprising:
 i) a first input connected to the second boundary scan cell and arranged to be fed with the third or fourth control signal,
 ii) a second input arranged to be fed with a fifth control signal able to get one of two values, and
 iii) an output connected to the output buffer and arranged to feed it with the third or fourth control signal in dependence on the value of the fifth control signal, the third control signal being intended for authorizing access of the first output signals to the first boundary scan cell and the fourth control signal being intended for authorizing the first boundary scan cell to feed the first switching means with the second dedicated signal, the control means may comprise:
a first logical AND gate connected to the first boundary scan cell, arranged to receive first input signals for core function mode purpose and a lock signal able to get one of two values and to control the access of the first input signals to the first boundary scan cell in dependence on the value of the lock signal, a general-purpose input path connected to the first boundary scan cell and arranged to feed the first boundary scan cell with the first dedicated signal, a first switching means arranged:
 i) to receive a second control signal able to get one of two values and the first output signals or the second dedicated signal and to selectively output the first output signals or the second dedicated signal as a function of the value of the second control signal, a second switching means connected to the first boundary scan cell and arranged:
 i) to receive a first control signal able to get one of two values and the first output signal or the second dedicated signal or else a second output signal of test mode purpose, outputted by the first boundary scan cell, and
 ii) to selectively feed the first switching means with the first output signal or the second dedicated signal or to feed a test output path of the pad logic module in dependence on the value of the first control signal, a third switching means arranged:
 i) to receive third and fourth control signals able to get one of two values and the second control signal and
 ii) to selectively output the third or fourth control signal in dependence on the value of the second control signal, a second logical AND gate comprising:
 i) a first inverting input arranged to be fed with the first control signal and a second input connected to the third switching means to be fed with the third or fourth control signal, and
 ii) an output connected to the second boundary scan cell and arranged to feed it with the third or fourth control signal in dependence on the inverted value of the first control signal, a first logical OR gate comprising:
 i) a first input connected to the second boundary scan cell and arranged to be fed with the third or fourth control signal,
 ii) a second input arranged to be fed with a sixth control signal able to get one of two values, and
 iii) an output connected to the output buffer and arranged to feed it with said third or fourth control signal in dependence on the value of the sixth control signal, the third control signal being intended for authorizing access of the first output signal to the first boundary scan cell and the fourth control signal being intended for authorizing the first boundary scan cell to feed the second switching means with the second dedicated signal or the second output signal, all the boundary scan cells of the pad ring are serially connected to form a serial register commonly named boundary scan register, loaded via top level pads and unloaded via top level pads. So both first and second boundary scan cells, inside the pad logic module of a Bolton pad, are serially connected between top level pins, to be fed with input signals delivered by the top level pads and to feed the top level pads with output signals, and to define a part of the serial register, the input buffer may comprise first and second control inputs to be fed with seventh and eighth control signals adapted to configure the pad cell in a normal mode (or input and/or output mode) and/or a repeater mode and/or a pull up mode and/or a pull down mode. Such an option is notably available in the PHILIPS library. This allows to control the pins to leave the pad in its functional state (but, most of the time the pads only act as input, output or are bi-directional pads).

The invention also provides an integrated circuit comprising at least one core with input and/or output pins and a group of input and/or output pads such as the one introduced above and defining together a pad ring connected to said input and/or output pins.

BRIEF DESCRIPTION OF THE DRAWINGS

Other features and advantages of the invention will become apparent on examining the detailed specifications hereafter and the appended drawings, wherein.

The appended drawings may not only serve to complete the invention, but also to contribute to its definition, if need be.

DESCRIPTION OF PREFERRED EMBODIMENTS

Figure 1:
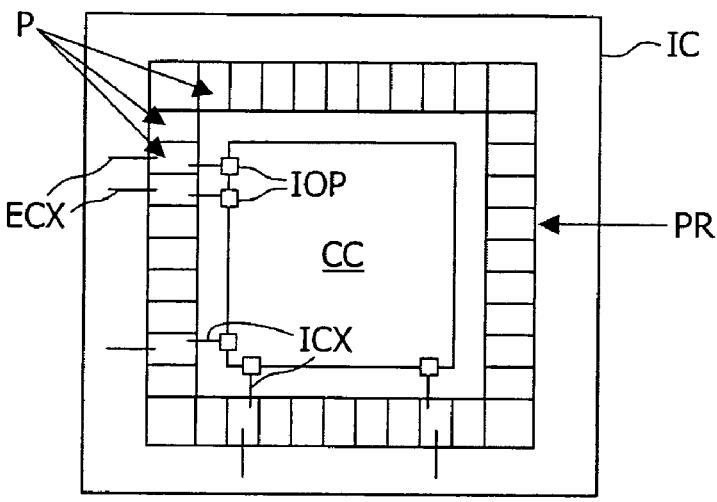
FIG. 1 schematically illustrates an integrated circuit comprising a core connected to a pad ring, FIG. 2 schematically illustrates a first example of embodiment of a Bolton pad according to the invention, dedicated to input scan test and/or data input, FIG. 3 schematically illustrates a second example of embodiment of a Bolton pad according to the invention, dedicated to output scan test and/or data output, FIG. 4 schematically illustrates a third example of embodiment of a Bolton pad according to the invention, dedicated to input scan test and/or data input and output, FIG. 5 schematically illustrates a fourth example of embodiment of a Bolton pad according to the invention, dedicated to output scan test and/or data input and output.

Reference is initially made to FIG. 1 to describe an example of an integrated circuit IC in which the invention may be applied.

In the following description it will be considered that the integrated circuit IC is intended for mobile electronic equipment such as a mobile phone, for instance a GSM/GPRS or UMTS mobile phone. But it is important to notice that the invention is not limited to this type of electronic equipment.

Indeed the invention may be applied to any electronic equipment comprising digital or mixed signals integrated circuit(s) needing power-down modes or requiring the core to be powered down when it is not used, to decrease the power consumption, or else needing performance such that delays introduced by the core internal test signal paths do not waste precious nanoseconds.

As illustrated in FIG. 1, an integrated circuit IC generally comprises at least one (chip) core CC dedicated to data (or signal) processing and comprising numerous input and/or output pins (or terminals) IOP to receive input signals (or data) to be processed and/or to deliver processed output signals (or data). Each core CC is usually surrounded by an integrated pad ring PR comprising numerous input and/or output pads P which are connected to at least one core input and/or output pin IOP through "internal" connections (or paths) ICX and to the outside through "external" connections (or paths) ECX.

In a pad ring PR, the pads P, that are used to test the core CC, are serially connected one to the other through paths connecting their boundary scan cell(s) BC via pins Tdi and Tdo that are respectively connected to top level pads (not shown). It is recalled that all the boundary scan cells of a pad ring are serially connected to form a serial register commonly named boundary scan register, loaded via top level pads and unloaded via top level pads. So both first BC1 and second BC2 boundary scan cells inside the pad logic module of a Bolton pad are serially connected between top level pins Tdi and Tdo.

The invention provides an input and/or output (Bolton) pad, hereafter named Bolton pad P, which comprises its own control logic (including the control test part).

Figure 2:
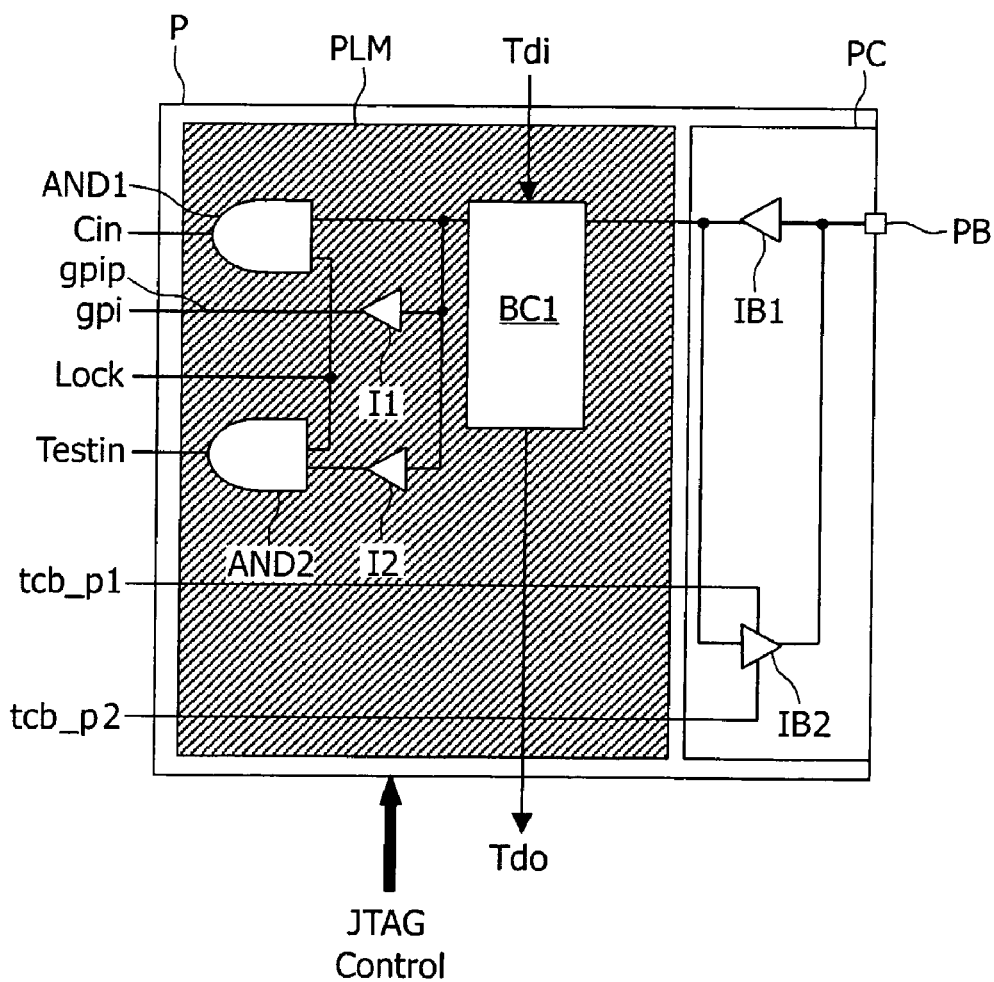

As illustrated in FIG. 2, a Bolton pad P according to the invention comprises a pad cell PC connected to a pad logic module PLM.

The pad cell PC comprises a pad block PB connected to an input buffer IB1, IB2 and/or an output buffer (OB—see FIG. 3) and intended to be connected to at least one of the core input and/or output pins IOP.

The pad logic module PLM comprises a first boundary scan cell BC1 and/or a second boundary scan cell (BC2—see FIG. 4) which is (are) connected to its pad block PB through the input buffer IB1, IB2 and/or the output buffer (OB) and is (are) arranged to feed (or drive) input signals to the pad block PB (intended for the core CC) and/or to deliver output signals from the pad block PB (intended for the outside).

The pad logic module PLM also comprises a control means connected to the first BC1 and/or second BC2 boundary scan cell(s) and arranged to receive control signals for controlling access to the first BC1 and/or second BC2 boundary scan cell(s) and feeding the first boundary scan cell BC1 with the input signals and/or outputting the output signals delivered by the first boundary scan cell BC1.

In the first example illustrated in FIG. 2, the Bolton pad P is only dedicated to input scan test and/or data input. In other words, the Bolton pad P is intended for working in a scan test mode and/or a function mode to feed the core CC with scan test data (or signals) and/or input data, therefore, the illustrated Bolton pad P only comprises a simplified pad logic module PLM, comprising one boundary scan cell BC1, and a simplified pad cell PC, comprising a pad block PB connected to an input buffer IB1, IB2.

For instance the input buffer is defined by two combined resistors IB1 and IB2 and controlled by two control signals (or commands) tcb_p1 and tcb_p2 coming from an external control module (not shown) located inside the core CC through the pad logic module PLM.

As illustrated when the (input) Bolton pad P is dedicated to scan test mode and function mode the control means of its pad logic module PLM comprises first AND1 and second AND2 logical AND gates and a general-purpose input path gpip.

The first logical AND gate AND1 comprises an output connected to the first boundary scan cell BC1, a first input arranged to receive first input signals ("0" or "1") Cin during the core function mode and a second input arranged to receive a lock signal ("0" or "1") Lock. This first logical AND gate AND1 controls the access of the first input signals Cin to the first boundary scan cell BC1 in dependence on the value of the inputted lock signal Lock.

For instance when the lock signal Lock is high (or equal to 1), the first input signals Cin can access the first boundary scan cell BC1 and then go to the pad block PB, through the input buffer IB1, IB2, to feed the core CC. Now, when the lock signal Lock is low (or equal to 0), the first input signals Cin cannot access the first boundary scan cell BC1, therefore, the core input and/or output pin IOP which is connected to the pad block PB is isolated from any first input signal Cin.

The second logical AND gate AND2 comprises an output connected to the first boundary scan cell BC1 through a buffer I1, a first input arranged to receive second input signals ("0" or "1") Testin during the core scan test mode and a second input arranged to receive the lock signal ("0" or "1") Lock. This second logical AND gate AND2 controls the access of the second input signals Testin to the first boundary scan cell BC1, through a buffer I2, in dependence on the value of the inputted lock signal Lock.

For instance when the lock signal Lock is high (or equal to 1), the second input signals Testin can access the first boundary scan cell BC1 and then the pad block PB, through the input buffer IB1, IB2, to feed the core CC. Now, when the lock signal Lock is low (or equal to 0), the second input signals Testin cannot access the first boundary scan cell BC1, therefore, the core input and/or output pin IOP, which is connected to the pad block PB, is isolated.

According to the invention, this access control, carried out by the control means of the pad logic module PLM, is intended for only authorizing the first Cin or second Testin input signals to access the first boundary scan cell BC1 when and only when the core CC is powered up, and, therefore, to forbid this access to them when the core CC is powered down. For this purpose the control means allows the power of the pad cell PC and pad logic module PLM to be maintained even when the core CC is powered down, in order to isolate the core input to which the pad block PB is connected.

The general-purpose input path gpip is intended to feed the first boundary scan cell BC1 with a first dedicated signal gpi of a chosen value (for instance a low value "0") preferably just after the access of the first Cin or second Testin input signal to the first boundary scan cell BC1 has been forbidden and just before the core CC is powered down. Thus, when the power of the core CC is down, the signal with a chosen value which it receives on its input pin IOP concerned, cannot disturb or damage its electronic integrated components (transistors).

In other words, when the power of the core CC must be reduced (or switched off) the control means switches from the function mode or test mode to the general-purpose input mode by means of a chosen value of the lock signal Lock.

It is important to notice that when the input Bolton pad P is only dedicated to the scan test mode, its control means only comprises the first logical AND gate AND1 and the general-purpose input path gpip. Moreover, when the input Bolton pad P is only dedicated to the function mode, its control means only comprises the second logical AND gate AND2 and the general-purpose input path gpip.

The JTAG Control signals are signals delivered by a JTAG ("Joint Test Access Group") top level controller in charge of generating test modes for the core CC, but also for the pad ring during test. The pins Tdi and Tdo are connected to the serial input/output of the JTAG controller. Serial data are shifted in via Tdi to generate test control via JTAG, while the responses are shifted out and observed via Tdo.

Figure 3:
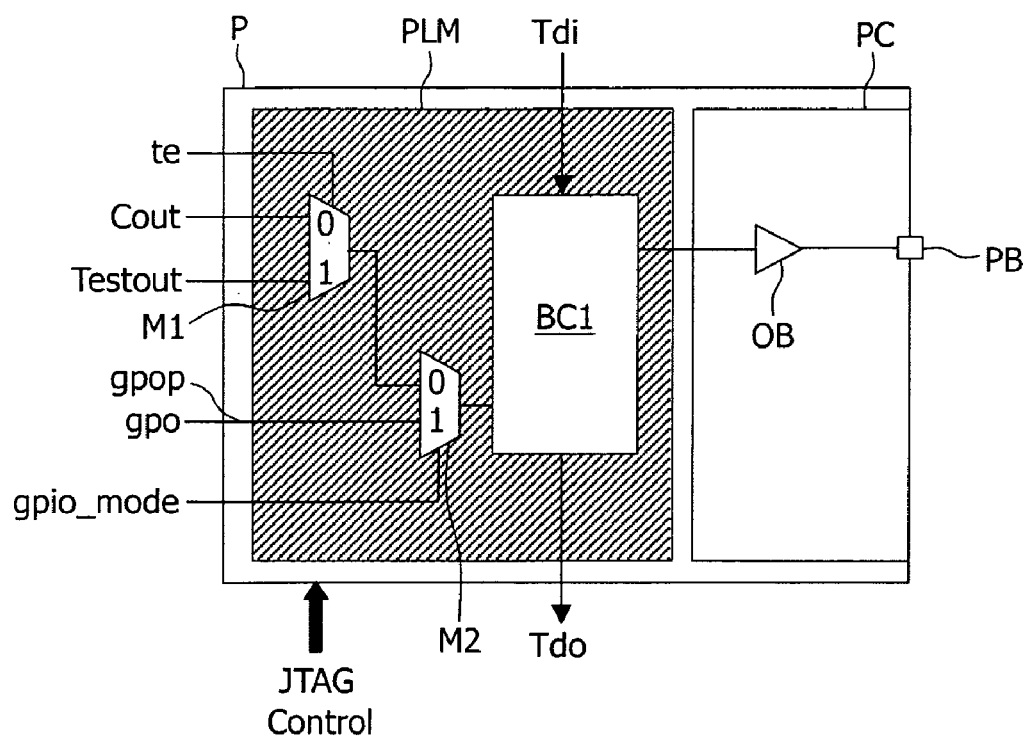

Reference is now made to FIG. 3 to describe a second example of Bolton pad P according to the invention, only dedicated to output scan test and/or data output. So, this (output) Bolton pad P is intended to work in a scan test mode and/or a function mode to collect (or drive outside) scan test data (or signals) and/or output data delivered by the core CC on at least one of its output pins IOP. For this purpose the illustrated Bolton pad P also comprises a simplified pad logic module PLM, comprising one boundary scan cell BC1, and a simplified pad cell PC, comprising a pad block PB connected to an output buffer OB.

As illustrated when the (output) Bolton pad P is dedicated to the scan test mode and function mode the control means of its pad logic module PLM comprises first M1 and second M2 switching means such as 1×2 multiplexers and a general-purpose output path gpop.

The first multiplexer M1 comprises a first input arranged to receive a first control signal ("0" or "1") te and a second input arranged to receive first Cout or second Testout output signals delivered by the core CC when it is working in the function mode or in the scan test mode, a first output to deliver the first output signals Cout and a second output to deliver the second output signals Testout.

The choice of the first or second output signals that must be selectively delivered depends on the value of the control signals te. For instance and as illustrated, when the value of te is set to "0" (low value) the first multiplexer M1 delivers the first output signals Cout on its first output, and when the value of te is set to "1" (high value) the first multiplexer M1 delivers the second output signals Testout on its second output.

In this second example the control means of the pad logic module PLM can only comprise the first multiplexer M1 connected to (and fed by) the first boundary scan cell BC1. But it is advantageous, as illustrated, for the control means also to comprise a second switching means M2 and a general-purpose output path gpop to control the access of the first Cout or second Testout output signals to the first multiplexer M1 and, therefore, to the outside when the power of the core CC is down (or switched off).

For this purpose, the second multiplexer M2 comprises a first input connected to the first boundary scan cell BC1 to receive the first Cout or second Testout output signals delivered by the core CC and a second input to receive a second control signal ("0" or "1") gpio_mode, a first output to deliver the first Cout or second Testout output signals intended for the first multiplexer M1 and a second output to deliver a second dedicated signal gpo with a chosen value on a general-purpose output path gpop.

This second dedicated signal gpo is preferably generated by the core CC.

The second multiplexer M2 controls the access of the second dedicated signal gpo or the first Cout or second Testout output signals to the outside in dependence on the value of the inputted second control signal gpio_mode.

For instance when the second control signal gpio_mode is low (or equal to 0), the first Cout or second Testout output signals can access the first multiplexer M1 and, therefore, the outside. Now, when the second control signal gpio_mode is high (or equal to 1), the second dedicated signal gpo with a chosen value can access the general-purpose output path gpop and, therefore, the outside. So the outside is isolated from the core input and/or output pin IOP which is connected to the pad block PB.

In other terms, gpo is used to drive a specific value outside the pad block PB thanks to the gpio_mode signal. In power-down mode the gpio_mode signal is used to get the gpo value and drive external pin of the pad block PB to high or low whatever the core supply. In a certain point of view the core is in power-down mode while the active pad ring drives known values to the outside world.

According to the invention, this outside access control, carried out by the control means of the pad logic module PLM, is intended only to authorize the first Cout or second Testout output signals to access to the outside when and only when the core CC is powered up, and, therefore, to forbid this access to them when the core CC is powered down. For this purpose, the control means allows the power of the pad cell PC and pad logic module PLM to be maintained even when the core CC is powered down, in order to isolate the outside from the core output pin IOP (not shown in the Figure) to which the pad block PB is connected.

The general-purpose output path gpop is intended to feed the outside with the second dedicated signal gpo of a chosen value, in dependence on the component connected to it, preferably just after the access of the first Cout or second Testout output signals to the first multiplexer M1 has been forbidden and just before the core CC is powered down. Thus, when the power of the core CC is down, the signal with a chosen value delivered by the isolated Bolton pad P cannot disturb the electronic integrated components (transistors) to which it is connected through an external connection ECX.

In other words, when the power of the core CC must be reduced (or switched off) the control means switches from the function mode or test mode to the general-purpose output mode by means of a chosen value of the second control signal gpio_mode.

It is important to notice that when the output Bolton pad P is only dedicated to scan test mode or to function mode, its control means only comprises the second multiplexer M2 and the general-purpose output path gpop.

Figure 4:
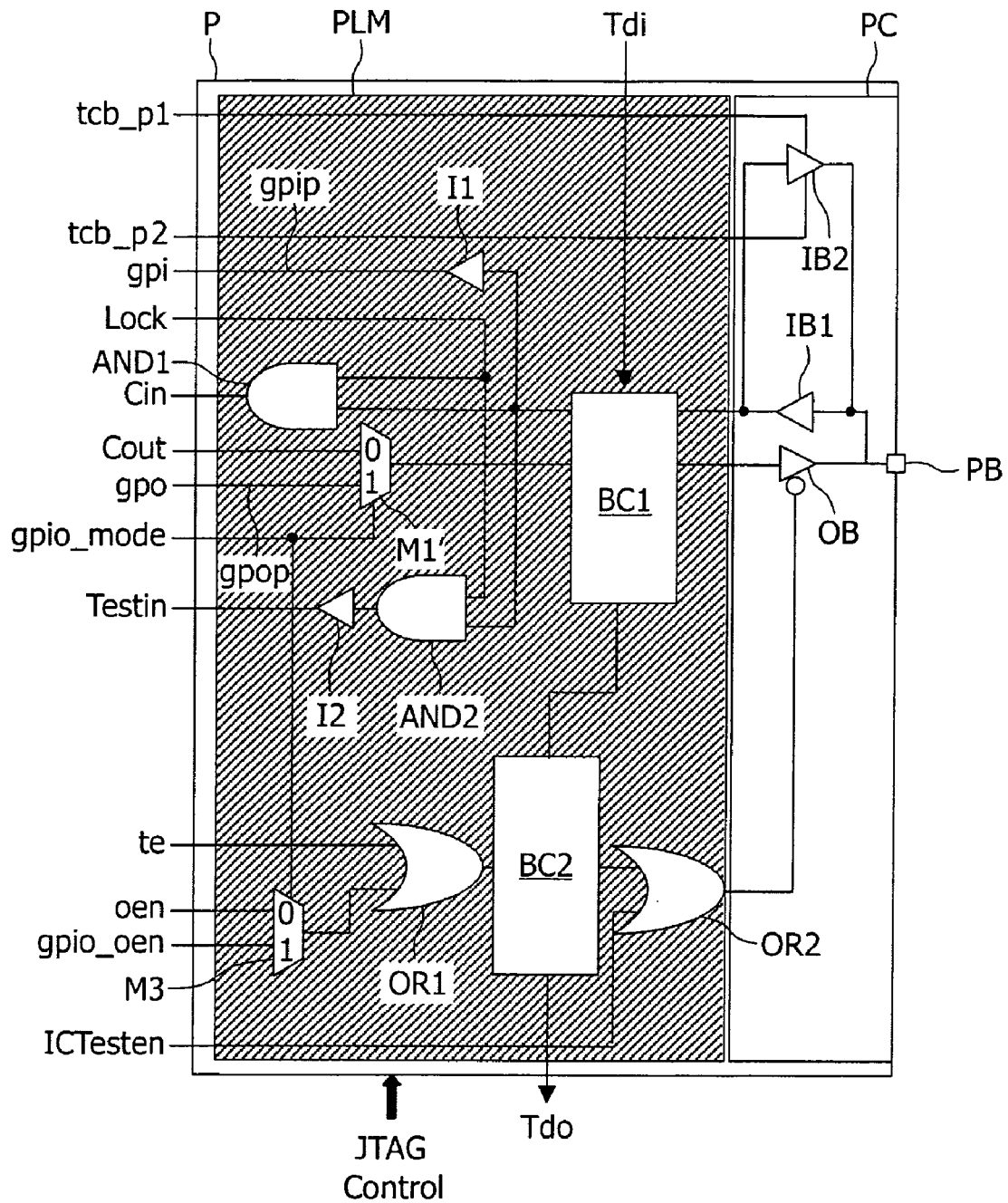

Reference is now made to FIG. 4 to describe a third example of Bolton pad P, according to the invention, dedicated to input scan test and/or data input and output. So, this (bidirectional) Bolton pad P is intended to work in a scan test mode to feed (or drive) the core CC with scan test data (or signals) and/or a function mode to feed (or drive) the core CC with input data (or signals) and deliver (or drive) the outside output data delivered by the core CC on at least one of its input and/or output pins IOP.

For this purpose, the illustrated Bolton pad P comprises a pad logic module PLM, comprising first BC1 and second BC2 boundary scan cells, and a pad cell PC, comprising a pad block PB connected to an input buffer IB1, IB2 (such as the one described above with reference to FIG. 2) and to a tri-sate output buffer OB.

As illustrated, when the (bidirectional) Bolton pad P is dedicated to input scan test mode and bidirectional function mode, the control means of its pad logic module PLM comprises an input control means (first AND1 and second AND2 logical AND gates and a general-purpose input path gpip such as the ones described above with reference to FIG. 2), which will not be described again hereafter, and an output control means which slightly differs from the one described above with reference to FIG. 3 (first M1 and second M2 switching means such as 1×2 multiplexers and a general-purpose output path gpop).

In this third example, the output control means comprises first M1' and second M3 switching means such as 1×2 multiplexers, a general-purpose output path gpop, and first OR1 and second OR2 logical OR gates.

The first multiplexer M1' comprises a first input connected to the first boundary scan cell BC1 to be fed with the first output signals Cout delivered by the core CC when it is working in the function mode, a second input to receive the second control signal gpio_mode (above described), a first output to deliver the first output signals Cout and a second output to deliver the second dedicated signal gpo with a chosen value, described above, on a general-purpose output path gpop.

This second dedicated signal gpo is preferably generated by the core CC.

The first multiplexer M1' controls the access of the second dedicated signal gpo or the first output signals Cout to the outside in dependence on the value of the inputted second control signal gpio_mode.

For instance when the second control signal gpio_mode is low (or equal to 0), the first output signals Cout can access the outside. Now, when the second control signal gpio_mode is high (or equal to 1), the second dedicated signal gpo with a chosen value can access the general-purpose output path gpop and, therefore, to the outside. So the outside is isolated from the core input and/or output pin IOP which is connected to the pad block PB.

According to the invention, this outside access control, carried out by the control means of the pad logic module PLM, is intended to authorize only the first output signals Cout to access the outside when and only when the core CC is powered up, and, therefore, to forbid this access to them when the core CC is powered down. For this purpose, the control means allows the power of the pad cell PC and pad logic module PLM to be maintained even when the core CC is powered down, in order to isolate the outside from the core output pin IOP to which the pad block PB is connected.

As mentioned before, the general-purpose output path gpop is intended to feed the outside with the second dedicated signal gpo of a chosen value preferably just after the access of the first output signals Cout to the first multiplexer M1' has been forbidden and just before the core CC is powered down. Thus, when the power of the core CC is down, the signal with a chosen value delivered by the isolated Bolton pad P cannot disturb the electronic integrated components (transistors) to which it is connected through an external connection ECX. In other words, when the power of the core CC must be reduced (or switched off) the control means switches from the function mode to the general-purpose output mode by means of a chosen value of the second control signal gpio_mode.

The second multiplexer M3 comprises a first input arranged to be fed with a third control signal oen ("output enable"), a second input arranged to be fed with a fourth control signal gpio_oen, a third input arranged to be fed with the second control signal gpio_mode, and an output to deliver the third oen or fourth gpio_oen control signal.

As will be described later, the third control signal oen is intended to authorize access of the first output signals Cout to the first boundary scan cell BC1 and the fourth control signal gpio_oen is intended to authorize the first boundary scan cell BC1 to feed the first multiplexer M1 with the second dedicated signal gpo.

The second multiplexer M2 controls the access of the third oen or fourth gpio_oen control signal to the first logical OR gate OR1 in dependence onin dependence on the value of the inputted second control signal gpio_mode.

For instance when the second control signal gpio mode is low (or equal to 0), the third control signal oen can access the first logical OR gate OR1. Now, when the second control signal gpio_mode is high (or equal to 1), the fourth control signal gpio_oen can access the logical OR gate OR1.

The first logical OR gate OR1 comprises a first input connected to the output of the second multiplexer M3, a second input arranged to be fed with the first control signal te ("test enable") intended for forcing the Bolton pad P to work in input mode during scan shifting, and an output connected to the second boundary scan cell BC2 to feed it with the first te or third oen or fourth gpio_oen control signal in dependence on their respective values and the value of the second control signal gpio_mode.

More precisely, the "te" signal is intended to control the scan shift mode (when "te"32 1) and the normal mode (when "te"=0, i.e. during normal functioning of the core CC). During the scan shift mode, the pad is forced in input mode, so data can be shifted into the core CC through this pad. During the normal mode, the pad can be in input or output mode via functional output enable signals oen and also gpio_oen. The functional logic generating these signals can be tested during scan normal mode.

The second logical OR gate OR2 comprises a first input connected to the output of the second boundary scan cell BC2 to be fed with the first te or third oen or fourth gpio_oen control signal, a second input arranged to be fed with a fifth control signal ICTesten, and an output connected to the inverted input of the tri-state output buffer OB to feed it with the first te or third oen or fourth gpio_oen or fifth ICTesten control signal in dependence on their respective values. The signal ICTesten is intended to force directly the pad in output mode or input mode, regardless of the JTAG control or core control.

If the tri-state output buffer OB receives a first control signal te actively, it forces the Bolton pad P to work in the input mode to feed the core CC with the first input signals Cin and testin in dependence on the lock signal value. If the tri-state output buffer OB receives the third control signal oen, it forces the Bolton pad P to work either in output mode to deliver the first output signals Cout, or in input mode. If the tri-state output buffer OB receives the fourth control signal gpio_oen, it forces the Bolton pad P to work either in output mode to deliver the second output signal gpo or in input mode to feed the core CC with the first input signals gpi. If the tri-state output buffer OB receives the fifth control signal ICTesten, it forces the Bolton pad P to work in the input mode to feed the core CC with the second input signals Testin, regardless of the JTAG control or core control.

With such an embodiment, when the integrated circuit IC does not operate a shift of the scan test vectors (corresponding to "te=0"), i.e. during the function mode clock cycle, the functional output enable "oen" can be tested, thus augmenting the observability of the core CC and the fault discovery of the test vectors.

Figure 5:
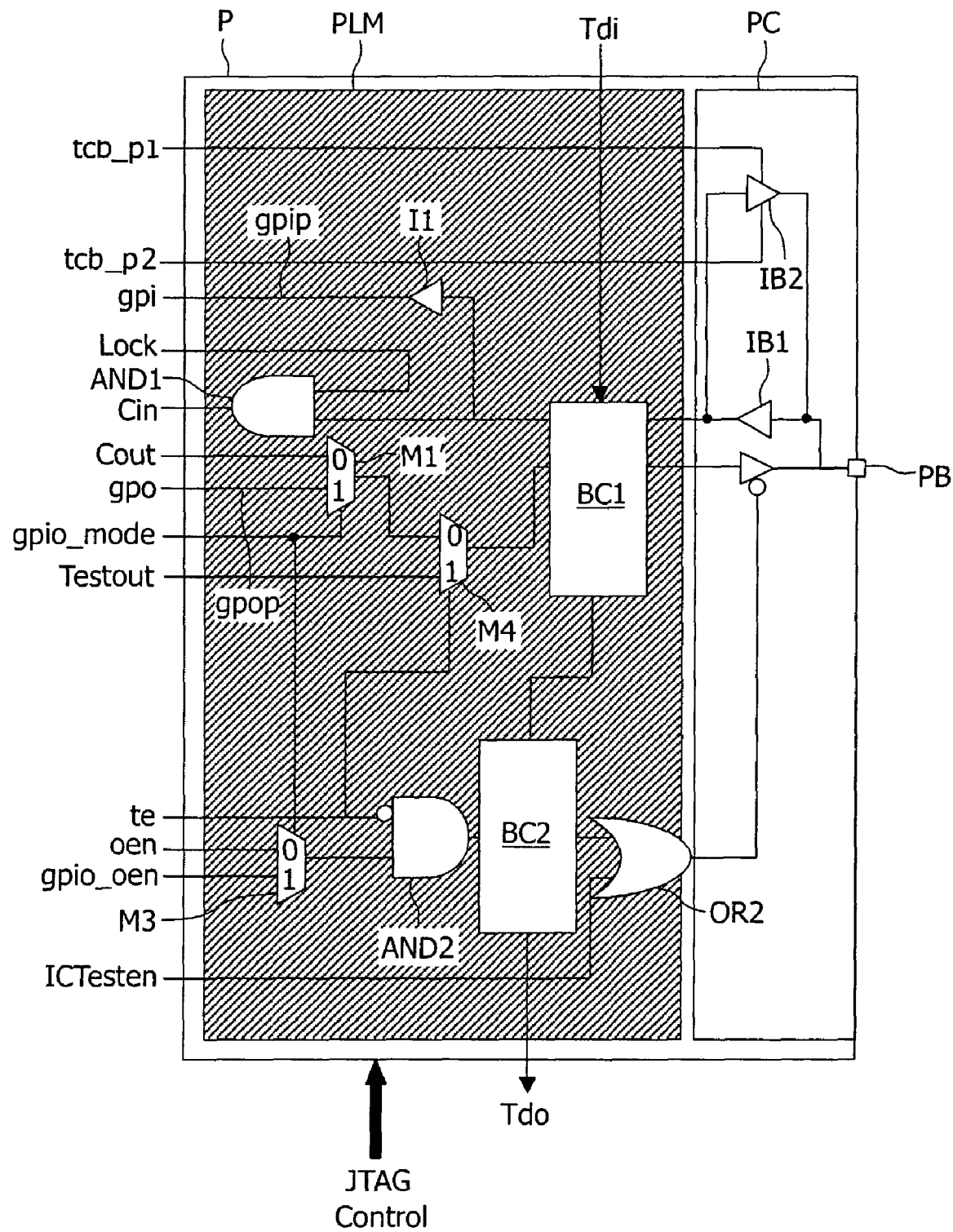

Reference is now made to FIG. 5 to describe a fourth example of Bolton pad P according to the invention, dedicated to output scan and/or data input and output. So, this (bidirectional) Bolton pad P is intended to work in a scan test mode to deliver (or drive) to the outside scan test data (or signals) outputted by the core CC and/or a function mode to feed (or drive) the core CC with input data (or signals) and deliver (or drive) to the outside output data delivered by the core CC on at least one of its input and/or output pins IOP.

For this purpose the illustrated Bolton pad P comprises a pad logic module PLM, comprising first BC1 and second BC2 boundary scan cells, and a pad cell PC, comprising a pad block PB connected to an input buffer IB1, IB2 (such as the one described above with reference to FIG. 2) and to a tri-sate output buffer OB (such as the one described above with reference to FIG. 4).

As illustrated when the (bidirectional) Bolton pad P is dedicated to the output scan test mode and bidirectional function mode, the control means of its pad logic module PLM comprises an input control means (first logical AND gate AND1 and a general-purpose input path gpip such as the ones described above with reference to FIG. 2), which will not be described again hereafter, and an output control means which slightly differs from the one described above with reference to FIG. 4.

In this fourth example, the output control means comprises first M1' and second M3 switching means, such as the one described above with reference to FIG. 4 and which will not be described again hereafter, a third switching means M4 such as a multiplexer 2×1, a general-purpose output path gpop, a second logical AND gate AND2 and a second logical OR gate OR2 such as the one described above with reference to FIG. 4.

The third multiplexer M4 comprises a first input connected to the first boundary scan cell BC1 to be fed with the first output signals Cout delivered by the core CC when it is working in the function mode or the second dedicated signal gpo with a chosen value delivered by the first boundary scan cell BC1 in the gpio mode or else the second output signals Testout delivered by the core CC when it is working in the scan test mode, a second input to receive the first control signal te (described above), a first output to deliver the first output signals Cout or the second dedicated signal gpo to the first multiplexer M1', and a second output to deliver the second output signals Testout to the outside.

The third multiplexer M4 controls the access of the first output signals Cout or the second dedicated signal gpo to the first multiplexer M1' or the second output signals Testout to the outside in dependence on the value of the inputted first control signal te.

For instance, when the first control signal te is low (or equal to 0), the first output signals Cout or the second dedicated signal gpo can access the first multiplexer M1' and, therefore, to the outside. When the second control signal gpio_mode is low (or equal to 0), the first output signals Cout can access the outside, because when the second control signal gpio_mode is high (or equal to 1), the second dedicated signal gpo with a chosen value can access the general-purpose output path gpop and, therefore, to the outside (so the outside is isolated from the core input and/or output pin IOP which is connected to the pad block PB).

Now, when the first control signal te is high (or equal to 1), the second output signals Testout can access the outside.

According to the invention, this outside access control, carried out by the control means of the pad logic module PLM, is intended only to authorize the first Cout or second Testout output signals to access the outside when and only when the core CC is powered up, and, therefore, to forbid this access to them when the core CC is powered down. For this purpose, the control means allows the power of the pad cell PC and pad logic module PLM to be maintained even when the core CC is powered down, in order to isolate the outside from the core output pin IOP to which the pad block PB is connected.

As mentioned before, the general-purpose output path gpop is intended to feed the outside with the second dedicated signal gpo of a chosen value preferably just after the access of the first output signals Cout to the first multiplexer M1' has been forbidden and just before the core CC is powered down. Thus, when the power of the core CC is reduced, the signal with a chosen value, delivered by the isolated Bolton pad P, cannot disturb the electronic integrated components (transistors) to which it is connected through an external connection ECX. In other words, when the power of the core CC must be reduced (or switched off) the control means switches from the function mode to the general-purpose output mode by means of a chosen value of the second control signal gpio_mode.

The second logical AND gate AND2 comprises a first input connected to the output of the second multiplexer M3 to be fed with the third oen or fourth gpio_oen control signal, a second inverted input to be fed with the first control signal te intended to force the Bolton pad P to work in input mode during scan shifting, and an output connected to the second boundary scan cell BC2 to feed it with the first inverted (non te) or third oen or fourth gpio_oen control signal in dependence on their respective values and the value of the second control signal gpio_mode.

As described in the third example of embodiment (illustrated in FIG. 4), i) if the tri-state output buffer OB receives a first control signal te="1", it forces the Bolton pad P to work in the input mode during scan shifting to feed the core CC with the first input signals Cin, ii) if the tri-state output buffer OB receives a third control signal oen="0" (when te="0"), it forces the Bolton pad P to work in the output mode to deliver the first output signals Cout (only when gpio_mode="0"), iii) if the tri-state output buffer OB receives the fourth control signal gpio_oen (when te="0"), it forces the Bolton pad P to work in the output mode to deliver the second output signal gpo (only when gpio_mode="1"), and iv) if the tri-state output buffer OB receives a fifth control signal ICTesten="0", it forces the Bolton pad P to work in the output mode to feed the outside with the second output signals Testout delivered by the core CC (only when te="1", i.e during scan shifting).

With such an embodiment, when the integrated circuit IC does not effect a shift of the scan test vectors (corresponding to "te=0"), i.e. during the function mode clock cycle, the functional output enable "Cout" can be observed, thus augmenting the observability of the core CC and the fault discovery of the test vectors.

Preferably, the integrated circuit IC and notably the Bolton pads P of each of its pad rings PR is realized in CMOS technology.

The invention is not limited to the embodiments of input and/or output pad and integrated circuit described above, only as examples, but it encompasses all alternative embodiments which may be considered by one skilled in the art within the scope of the claims hereafter.

The invention claimed is:

1. An input and/or output pad for an integrated circuit, said input and/or output pad comprising:
   a pad cell including a pad block connected to an input buffer and/or an output buffer and said pad block arranged to be connected between said input buffer and/or output buffer and one of input and/or output pins-of a core of said integrated circuit;
   a pad logic module including: a first boundary scan cell and/or a second boundary scan cell, connected to said pad block through said input buffer and/or output buffer and arranged to feed input signals to and/or deliver output signals from said pad block, and control means connected to said first and/or second boundary scan cell and adapted to receive control signals for controlling access to said first and/or second boundary scan cell and feeding said first boundary scan cell with said input signals and/or outputting said output signals delivered by said first boundary scan cell, wherein said access is controlled in dependence on said control signals; and
   characterized in that said control means is arranged to forbid the access of said input signals to said first boundary scan cell while allowing the power of said pad cell and pad logic module to be maintained, just before said core is powered down in order to isolate the core input to which said pad block is connected.

2. The input and/or output pad according to claim 1, characterized in that said control means is arranged to feed said first boundary scan cell with a first dedicated signal of a chosen value while forbidding said access of said input signals and allowing the power of said pad cell and pad logic module to be maintained.

3. The input and/or output pad according to claim 1, characterized in that said control mean comprises:
   a first logical AND gate connected to said first boundary scan cell arranged to receive first input signals for core function mode purpose and a lock signal able to get one of two values and to control said access of said first input signals to said first boundary scan cell in dependence on the value of said lock signal; and/or
   a second logical AND gate connected to said first boundary scan cell arranged to receive second input signals for core test mode purpose and said lock signal and to control said access of said second input signals to said first boundary scan cell in dependence on the value of said lock signal.

4. The input and/or output pad according to claim 2, characterized in that said control means comprises a general-purpose input path connected to said first boundary scan cell and arranged to feed said first boundary scan cell with said first dedicated signal.

5. The input and/or output pad according claim 1, characterized in that said control means is arranged to allow the power of said pad cell and pad logic module to be maintained and to forbid the access of said output signals to said first boundary scan cell each time said core is powered down.

6. The input and/or output pad according to claim 5, characterized in that said control means is arranged to deliver a second dedicated signal of a chosen value on an output of said pad logic module while forbidding said access of said output signals to said first boundary scan cell and allowing the power of said pad cell and pad logic module to be maintained.

7. The input and/or output pad according to claim 6, characterized in that said control means comprises a first switching means arranged to receive i) a first control signal able to get one of two values and ii) first output signals of core function mode and/or second output signals of core test mode to selectively output said first output signals and/or said second output signals as a function of the value of said first control signals.

8. The input and/or output pad according to claim 7, characterized in that said control means comprises a second switching means connected to said first boundary scan cell and arranged i) to receive a second control signal able to get one of two values and said first output signals delivered by said first boundary scan cell and ii) to selectively output said first output signals intended for said first switching means or said second dedicated signal on a general-purpose output path in dependence on the value of said second control signal.

9. The input and/or output pad according to claim 6, characterized in that said control means comprises a first switching means connected to said first boundary scan cell arranged to receive a second control signal and said output signals delivered by said first boundary scan cell and to selectively output said output signals or said second dedicated signal as a function of the value of said second control signals.

10. The input and/or output pad according to claim 9, characterized in that said control means comprises:
    a second switching means arranged i) to receive third and fourth control signals able to get one of two values and said second control signal and ii) to selectively output said third or fourth control signals in dependence on the value of said second control signal;
    a first logical OR gate comprising i) a first input arranged to be fed with said first control signal and a second input connected to said second switching means to be fed with said third or fourth control signals, and ii) an output connected to said second boundary scan cell and arranged to feed it with said third or fourth control signals in dependence on the value of said first control signal;
    a second logical OR gate comprising i) a first input connected to said second boundary scan cell and arranged to be fed with said third or fourth control signals, ii) a second input arranged to be fed with a fifth control signal able to get one of two values, and iii) an output connected to said output buffer and arranged to feed it with said third or fourth control signals in dependence on the value of said fifth control signal said third control signal being intended for authorizing access of said first output signals to said first boundary scan cell and said fourth control signal being intended for authorizing said first boundary scan cell to feed said first switching means with said second dedicated signal.

11. The input and/or output pad according to claim 1, characterized in that said control means comprises:
    a first logical AND gate connected to said first boundary scan cell arranged to receive first input signals for core function mode purpose and a lock signal able to get one of two values and to control said access of said first input signals to said first boundary scan cell in dependence on the value of said lock signal;
    a general-purpose input path connected to said first boundary scan cell and arranged to feed said first boundary scan cell with said first dedicated signal;

a first switching means arranged i) to receive a second control signal able to get one of two values and said first output signals or said second dedicated signal and to selectively output said first output signals or said second dedicated signal as a function of the value of said second control signals;

a second switching means connected to said first boundary scan cell and arranged i) to receive a first control signal able to get one of two values and said first output signals or said second dedicated signal or else a second output signals of test mode purpose outputted by said first boundary scan cell and ii) to selectively feed said first switching means with said first output signals or said second dedicated signal or to feed a test output path of said pad logic module with said second output signals in dependence on the value of said first control signal;

a third switching means arranged i) to receive third and fourth control signals able to get one of two values and said second control signal and ii) to selectively output said third or fourth control signals in dependence on the value of said second control signal;

a second logical AND gate comprising i) a first inverting input arranged to be fed with said first control signal and a second input connected to said third switching means to be fed with said third or fourth control signals, and ii) an output connected to said second boundary scan cell and arranged to feed it with said third or fourth control signals in dependence on the value of the inverted value of said first control signal;

a first logical OR gate comprising i) a first input connected to said second boundary scan cell and arranged to be fed with said third or fourth control signals, ii) a second input arranged to be fed with a sixth control signal able to get one of two values, and iii) an output connected to said output buffer and arranged to feed it with said third or fourth control signals in dependence on the value of said sixth control signal, said third control signal being intended for authorizing access of said first output signals to said first boundary scan cell and said fourth control signal being intended for authorizing said first boundary scan cell to feed said second switching means with said second dedicated signal or said second output signal.

12. The input and/or output pad according claim 1, characterized in that said first boundary scan cell and said second boundary scan cell are serially connected between top level pins, to be fed with input signals delivered by top level pads and to feed top level pads with output signals and to define a part of a serial register.

13. The input and/or output pad according claim 1, characterized in that said input buffer comprises first and second control inputs to be fed with seventh and eighth control signals adapted to configure said pad cell in a normal mode and/or a repeater mode and/or a pull up mode and/or a pull down mode.

14. An integrated circuit comprising:
a core with input and/or output pins;
a plurality of input and/or output pads including a pad cell including a pad block connected to an input buffer and/or an output buffer and said pad block arranged to be connected between said input buffer and/or output buffer and one of input and/or output pins of said core, said input and/or output pins further including a pad logic module including: a first boundary scan cell and/or a second boundary scan cell connected to said pad block through said input buffer and/or output buffer and arranged to feed input signals to and/or deliver output signals from said pad block, and control means connected to said first and/or second boundary scan cell and adapted to receive control signals for controlling access to said first and/or second boundary scan cell and feeding said first boundary scan cell with said input signals and/or outputting said output signals delivered by said first boundary scan cell, wherein said access is controlled in dependence on said control signals;

said plurality of input and/or output pads defining together a pad ring connected to said input and/or output pins; and characterized in that said control means is arranged to allow the power of said pad cell and pad logic module to be maintained and to forbid the access of said output signals to said first boundary scan cell each time said core is powered down.

15. The integrated circuit according to claim 14, characterized in that said control means is arranged to deliver a second dedicated signal of a chosen value on an output of said pad logic module while forbidding said access of said output signals to said first boundary scan cell and allowing the power of said pad cell and pad logic module to be maintained.

16. The integrated circuit according to claim 15, characterized in that said control means comprises a first switching means connected to said first boundary scan cell arranged to receive a second control signal and said output signals delivered by said first boundary scan cell and to selectively output said output signals or said second dedicated signal as a function of the value of said second control signal.

17. The integrated circuit according to claim 16, characterized in that said control means comprises:
a second switching means arranged i) to receive third and fourth control signals able to get one of two values and said second control signal and ii) to selectively output said third or fourth control signals in dependence on the value of said second control signal;

a first logical OR gate comprising i) a first input arranged to be fed with said first control signal and a second input connected to said second switching means to be fed with said third or fourth control signals, and ii) an output connected to said second boundary scan cell and arranged to feed it with said third or fourth control signals in dependence on the value of said first control signal;

a second logical OR gate comprising i) a first input connected to said second boundary scan cell and arranged to be fed with said third or fourth control signals, ii) a second input arranged to be fed with a fifth control signal able to get one of two values, and iii) an output connected to said output buffer and arranged to feed it with said third or fourth control signals in dependence on the value of said fifth control signal, said third control signal being intended for authorizing access of said first output signals to said first boundary scan cell and said fourth control signal being intended for authorizing said first boundary scan cell to feed said first switching means with said second dedicated signal.

18. The integrated circuit according to claim 17, characterized in that said control means comprises:
a first logical AND gate connected to said first boundary scan cell arranged to receive first input signals for core function mode purpose and a lock signal able to get one of two values and to control said access of said first input signals to said first boundary scan cell in dependence on the value of said lock signal;

a general-purpose input path connected to said first boundary scan cell and arranged to feed said first boundary scan cell with said first dedicated signal;

a first switching means arranged i) to receive a second control signal able to get one of two values and said first output signals or said second dedicated signal and to selectively output said first output signals or said second dedicated signal as a function of the value of said second control signal;

a second switching means connected to said first boundary scan cell and arranged i) to receive a first control signal able to get one of two values and said first output signals or said second dedicated signal or else a second output signals of test mode purpose outputted by said first boundary scan cell and ii) to selectively feed said first switching means with said first output signals or said second dedicated signal or to feed a test output path of said pad logic module with said second output signals in dependence on the value of said first control signal;

a third switching means arranged i) to receive third and fourth control signals able to get one of two values and said second control signal and ii) to selectively output said third or fourth control signals in dependence on the value of said second control signal;

a second logical AND gate comprising i) a first inverting input arranged to be fed with said first control signal and a second input connected to said third switching means to be fed with said third or fourth control signals, and ii) an output connected to said second boundary scan cell and arranged to feed it with said third or fourth control signals in dependence on the value of the inverted value of said first control signal;

a first logical OR gate comprising i) a first input connected to said second boundary scan cell and arranged to be fed with said third or fourth control signals, ii) a second input arranged to be fed with a sixth control signal able to get one of two values, and iii) an output connected to said output buffer and arranged to feed it with said third or fourth control signals in dependence on the value of said sixth control signal, said third control signal being intended for authorizing access of said first output signals to said first boundary scan cell and said fourth control signal being intended for authorizing said first boundary scan cell to feed said second switching means with said second dedicated signal or said second output signal.

* * * * *